US008619476B2

(12) United States Patent
Chu

(10) Patent No.: US 8,619,476 B2
(45) Date of Patent: Dec. 31, 2013

(54) SEMICONDUCTOR MEMORY APPARATUS COMPRISING A NONVOLATILE MEMORY CELL AND METHOD OF OPERATING THE SAME

(75) Inventor: Gyo Soo Chu, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 240 days.

(21) Appl. No.: 13/160,000

(22) Filed: Jun. 14, 2011

(65) Prior Publication Data
US 2012/0099379 A1 Apr. 26, 2012

(30) Foreign Application Priority Data
Oct. 26, 2010 (KR) .......................... 10-2010-0104853

(51) Int. Cl.
*G11C 13/04* (2006.01)
(52) U.S. Cl.
USPC ............ 365/185.21; 365/185.11; 365/185.24; 365/185.17; 365/185.29
(58) Field of Classification Search
USPC ............. 365/185.21, 185.11, 185.24, 185.17, 365/185.29
See application file for complete search history.

(56) References Cited

U.S. PATENT DOCUMENTS 5,576,992 A * 11/1996 Mehrad .................... 365/185.24
5,917,751 A * 6/1999 Wakita ..................... 365/185.11
7,596,030 B2 * 9/2009 Wu .......................... 365/185.19

FOREIGN PATENT DOCUMENTS

KR 1020020031315 5/2002
KR 1020060046172 5/2006

OTHER PUBLICATIONS

Notice of Allowance issued from the Korean Intellectual Property Office on Jul. 31, 2012.

* cited by examiner

*Primary Examiner* — Connie Yoha
(74) *Attorney, Agent, or Firm* — IP & T Group LLP

(57) ABSTRACT

A semiconductor memory apparatus includes a memory block including memory strings having respective channel layers coupled between respective bit lines and a source line, an operation circuit group configured to supply hot holes to the channel layers and to perform an erase operation on memory cells of the memory strings, an erase operation determination circuit configured to generate a block erase enable signal when hot holes of at least a target number are supplied to a first channel layer of the channel layers, and a control circuit configured to perform the erase operation in response to the block erase enable signal.

20 Claims, 5 Drawing Sheets

SEMICONDUCTOR MEMORY APPARATUS COMPRISING A NONVOLATILE MEMORY CELL AND METHOD OF OPERATING THE SAME

CROSS-REFERENCE TO RELATED APPLICATION

Priority to Korean patent application number 10-2010-0104853 filed on Oct. 26, 2010, the entire disclosure of which is incorporated by reference herein, is claimed.

BACKGROUND

Exemplary embodiments relate to a semiconductor memory apparatus and a method of operating the same and, more particularly, to a nonvolatile memory device and a method of operating the same.

A semiconductor memory apparatus includes memory devices for storing data. In order to increase the integration degree of memory devices, memory devices are being reduced in size. However, such a reduction in size is reaching limits due to restrictions in, for example, semiconductor materials or process conditions.

To address such a concern, memory devices are being produced as a three-dimensional (3-D) structure. In transitioning the structure of the memory device from a 2-D structure to the 3-D structure, manufacture processes and operation conditions are changed. Further, operation conditions of memory devices have to be set in an optimal state.

BRIEF SUMMARY

According to exemplary embodiments of this disclosure, the operating characteristic of a semiconductor memory apparatus can be improved by detecting operation conditions and operating the semiconductor memory apparatus in response to the detection.

A semiconductor memory apparatus according to an aspect of the present disclosure includes a memory block including memory strings having respective channel layers coupled between respective bit lines and a source line, an operation circuit group configured to supply hot holes to the channel layers and to perform an erase operation on the memory cells of the memory strings, an erase operation determination circuit configured to generate a block erase enable signal when hot holes of a target number are supplied to a first channel of the channel layers, and a control circuit configured to perform the erase operation in response to the block erase enable signal.

A method of operating a semiconductor memory apparatus according to another aspect of this disclosure includes supplying hot holes to the channel layers of memory strings coupled between respective bit lines and a source line, comparing a target number and the number of hot holes supplied to each of the channel layers, and performing an erase operation on the memory cells of the memory strings when hot holes of at least the target number have been supplied to the channel layers.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
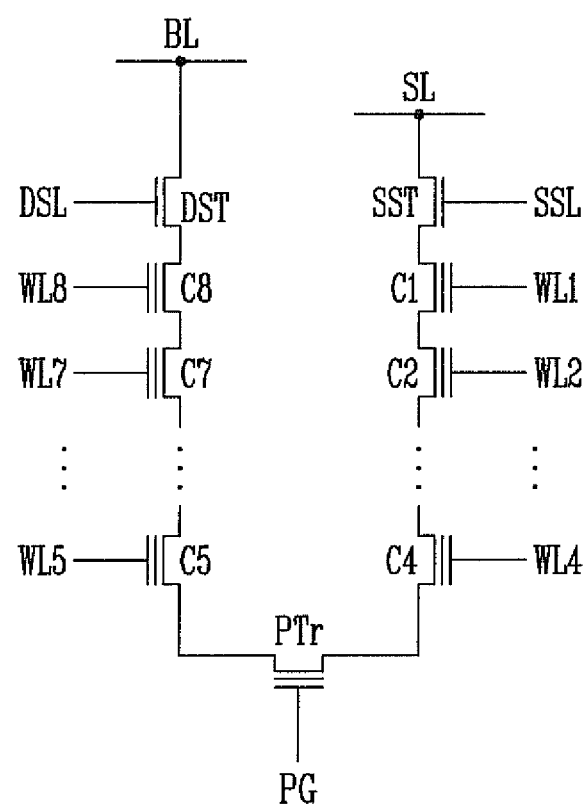
FIG. 1 is a circuit diagram of a semiconductor device according to an exemplary embodiment of this disclosure.

FIG. 1 is a circuit diagram of a semiconductor device according to an exemplary embodiment of this disclosure.

Referring to FIG. 1, a common memory string of a NAND flash memory device (that is, a typical nonvolatile memory device) includes a drain select transistor DST configured to have a drain coupled to a bit line BL, a source select transistor SST configured to have a source coupled to a source line SL, and a plurality of memory cells C1 to C8 coupled in series between the drain select transistor and the source select transistor. Here, the number of memory cells may be changed as appropriate for different environments that the semiconductor device may be used. For example, the number of memory cells may be 8.

A pipe transistor PTr is coupled between the pair of memory cells C4, C5 placed in the middle of the cell string of a 3-D structure. Accordingly, some (C1 to C4) of the memory cells C1 to C8 of the cell string are coupled in series between the source select transistor SST and the pipe transistor PTr, thus forming a first memory group. The remaining memory cells C5 to C8 are coupled in series between the drain select transistor DST and the pipe transistor PTr, thus forming a second memory group.

The pipe transistor PTr is formed in a substrate. The drain select transistor DST and the memory cells C1 to C4 of the first memory group are arranged in series between the bit line BL and the pipe transistor PTr in a vertical direction from the substrate. The source select transistor SST and the memory cells C5 to C8 of the second memory group are arranged in series between the source line SL and the pipe transistor PTr in a vertical direction vertical from the substrate. According to an example, the number of memory cells C1 to C4 of the first memory group and the number of memory cells C5 to C8 of the second memory group preferably are the same. Since the memory cells C1 to C8 are vertically stacked, the direction of channels through the memory cells C1 to C8 is vertical to the substrate. Furthermore, since the memory cells C1 to C8 of the memory string are divided into the first and second memory groups, one memory string includes two vertical channel layers that are each vertical to the substrate.

The pipe transistor PTr functions to electrically couple the channel region of the memory cells C1 to C4 of the first memory group and the channel region of the memory cells C5 to C8 of the second memory group. The structure of a semiconductor device including the 3-D memory string is described in more detail below.

Figure 2:
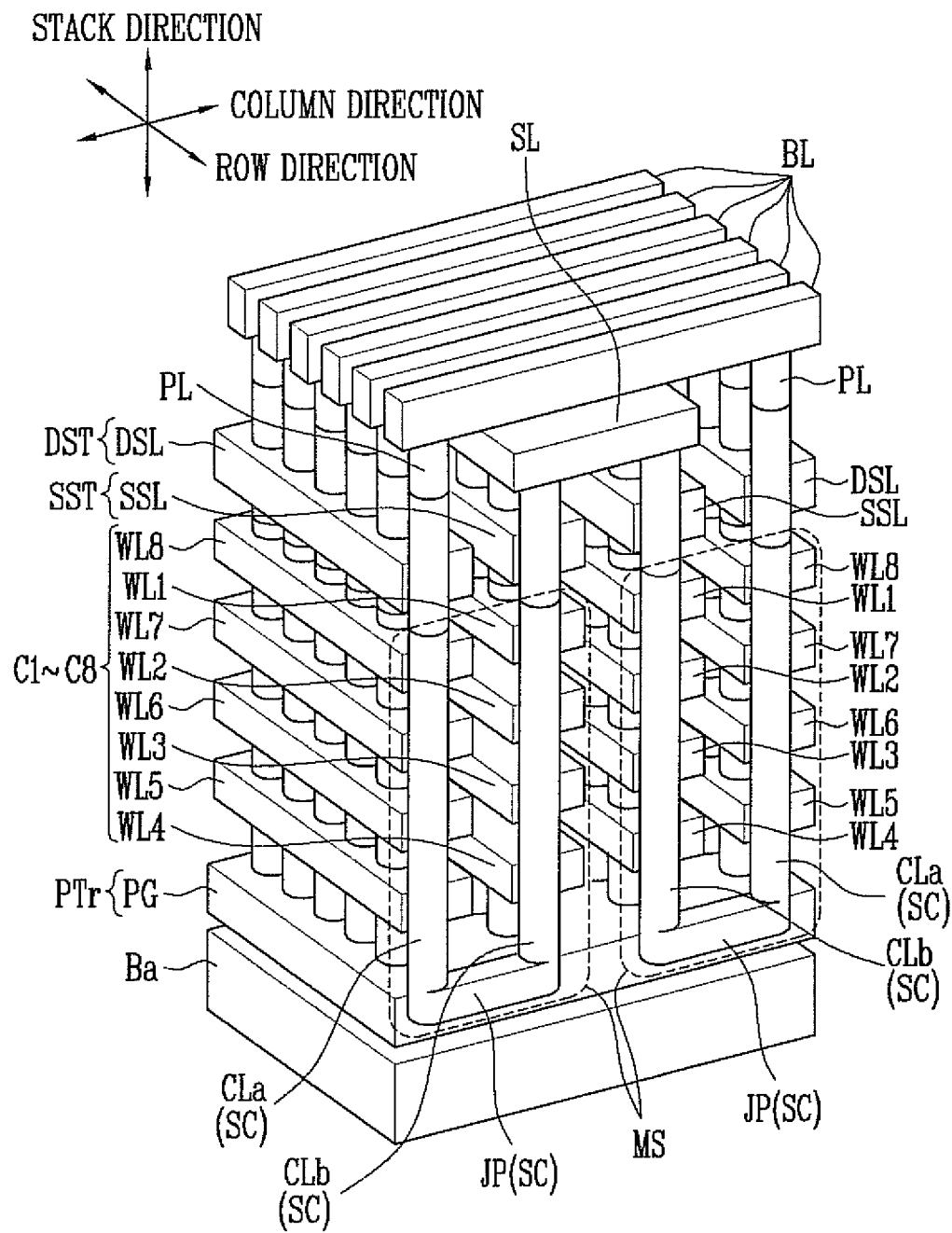
FIG. 2 is a perspective view showing the structure of the semiconductor device for implementing circuits of FIG. 1.

FIG. 2 is a perspective view showing the structure of the semiconductor device that includes circuits of FIG. 1. More particularly, FIG. 2 is a perspective view of memory blocks included in a memory array of a semiconductor memory apparatus. The memory block as shown includes 6×2 memory strings MS, a source select transistors SST, and a drain select transistors DST.

Referring to FIG. 2, the memory block includes the plurality of memory strings MS. As will be described later, each of the memory strings MS includes a plurality of electrically rewritable memory cells C1 to C8. The memory cells C1 to C8 are coupled in series. The memory cells C1 to C8 forming one memory string MS are formed by stacking a plurality of semiconductor layers. Each of the memory strings MS includes a channel layer SC, word lines WL1 to WL8, and a pipe gate PG. The channel layer SC formed by the memory string MS may be a U-shaped 3-D structure. According to an example, the channel layer SC may be formed of a polysilicon layer doped with impurity having five valence electrons.

The U-shaped channel layer SC has a U shape when viewed from the front of the FIG. 2 structure. The U-shaped channel layer SC includes a pair of columnar portions CLa and CLb that extend in a substantially vertical direction from a semiconductor substrate Ba and a coupling portion JP formed to couple the lower ends of the columnar portions CLa and CLb. The columnar portions CLa and CLb may be in a cylindrical column shape or a square pillar shape. Further, the columnar portions CLa and CLb may have any other reasonably suitable column shape. Here, as shown by arrows in FIG. 2, a row direction is at a right angle to the stack direction, and a column direction is at a right angle to the stack direction and the row direction.

In the U-shaped channel layer SC, a line (e.g., coupling portion JP) to couple the center axes of the pair of columnar portions CLa and CLb is disposed in parallel to the column direction. Furthermore, the U-shaped channel layers SC are disposed to form a matrix on a plane stretching in the row direction and the column direction.

The word lines WL1 to WL8 formed on layers are extended in the row direction. The word line WL1 to WL8 are insulated and separated from each other and as a group are repeatedly formed at a desired pitch in the column direction. The word line WL1 is formed on the same layer as the word line WL8. Likewise, the word line WL2 is formed on the same layer as the word line WL7, the word line WL3 is formed on the same layer as the word line WL6, and the word line WL4 is formed on the same layer as the word line WL5.

The gates of the memory cells C1 to C8 are provided at the same position of the memory cells with respect to the column direction and the gates of the memory cells C1 to C8 of plural memory strings are configured to form a line in the row direction. Here, the gates of the memory cells C1 to C8 are coupled to the respective word lines WL1 to WL8. Although not shown, each end of the word lines WL1 to WL8 in the row direction is a stepped structure. The word lines WL1 to WL8 are formed to surround the plurality of columnar portions CLa and CLb, where the plurality of columnar portions CLa and CLb form rows in the row direction.

An Oxide-Nitride-Oxide (ONO) layer (not shown) is formed between the word lines WL1 to WL8 and the columnar portions CLa and CLb. The ONO layer includes a tunnel insulating layer adjacent to the columnar portions CLa and CLb, a charge trap layer adjacent to the tunnel insulating layer, and a block insulating layer adjacent to the charge trap layer. As apparent to a person of ordinary skill in the art, the charge trap layer functions to trap electric charges. Here, the charge trap layer is formed to surround the entire surface of the columnar portions CLa and CLb and the coupling portion JP, and the word lines WL1 to WL8 are formed to surround the charge trap layer.

The drain select transistor DST includes a corresponding portion of a columnar channel layer CLa and a drain selection line DSL. The columnar channel layer CLa is formed to extend in a direction vertical to the substrate Ba.

The drain selection line DSL is provided over the word line WL8 which is at the highest location for the word lines. The drain selection line DSL extends in the row direction. In the column direction, the drain selection lines DSL are alternated with source selection lines SSL and have a desired pitch between the drain selection lines DSL. Here, in the row direction, the drain selection lines DSL have a gap interposed therebetween and are each formed to surround a corresponding row of columnar channel layers CLa in the row direction.

The source select transistor SST includes a corresponding portion of a columnar channel layer CLb and a source selection line SSL. The source selection line SSL is provided over the word line WL1 which is at the highest location for the word lines. The source selection line SSL extends in the row direction. In the column direction, the source selection lines SSL are alternated with the drain selection line DSL and have a desired pitch between the source selection lines SSL. Here, in the row direction, the source selection lines SSL have a gap interposed therebetween and are each formed to surround a corresponding row of columnar channel layers CLb.

The pipe gate PG is formed to cover the lower portions of the plurality of coupling portions JP and extended two-dimensionally in the row direction and the column direction.

In the column direction, a plurality of columnar channel layers CLb are placed next to each other. The upper ends of columnar channel layers CLb are coupled to a source line SL as shown in FIG. 2. Here, the source line SL is commonly coupled to the columnar channel layers CLb.

Bit lines BL are formed at the top of the columnar channel layers CLa and may be coupled to the columnar channel layers CLa through respective plugs PL. The bit lines BL are disposed over the source line SL. The bit lines BL are repeatedly extended in the column direction and are formed to have a gap therebetween in the row direction.

If the FIG. 2 circuitry was a two-dimensional memory string structure, when a high voltage of about 20 V is supplied to a P-well in an erase operation, electrons trapped in the floating gates of memory cells are discharged toward the P-well owing to a high voltage difference between the P-well and the floating gates, so that the memory cells are erased. However, the FIG. 2 circuitry is a three-dimensional memory string structure, and the erase operation is performed differently.

Figure 3:
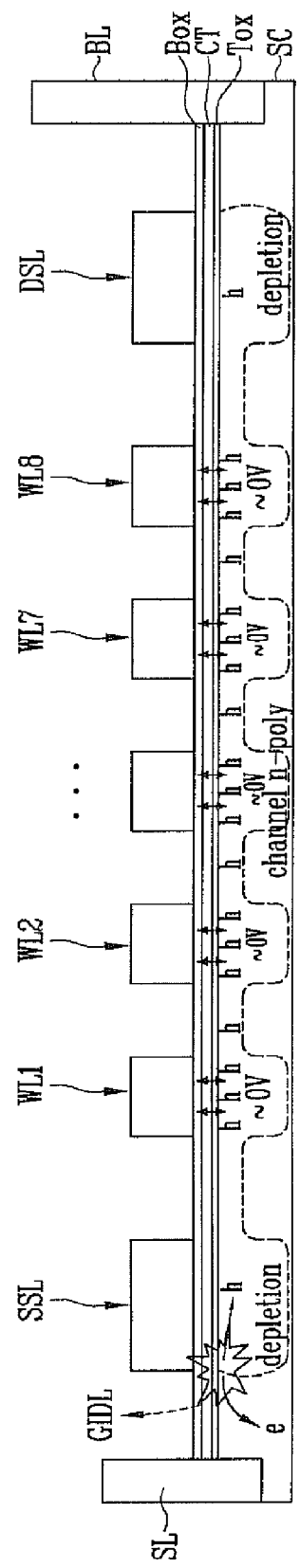
FIG. 3 is a cross-sectional view illustrating the operation of a memory string shown in FIG. 2 by depicting a U-shaped memory string in FIG. 2 as if it was a straight horizontal string.

FIG. 3 is a cross-sectional view illustrating the operation of the memory string shown in FIG. 2 by depicting a U-shaped memory string in FIG. 2 as if it was a straight horizontal string.

Referring to FIG. 3, an ONO layer is formed to include a tunnel insulating layer Tox, a charge trap layer CT, and a block insulating layer Box, consistent with the description of an ONO layer above with reference to FIG. 2. The ONO layer including the tunnel insulating layer Tox, the charge trap layer CT, and the block insulating layer Box is formed between the word lines WL1 to WL8 and the channel layer SC. According to an example, the charge trap layer CT may be formed of a nitride layer.

If an erasure operation is performed too soon, sufficient charges may not be distributed throughout the channel layer SC so that adequate discharge of electrons trapped in the charge trap layer CT and thus erasure of the memory cells may not be properly performed. According to an exemplary embodiment, sufficient distribution of charges in the channel layer SC for performing erasure operation is detected by sensing that a voltage of the bit line BL is sufficiently high where the voltage of the bit line BL indicates the voltage of the channel layer SC due to charge accumulation. While, hole pairs can be sufficiently created in the channel layer SC given enough time so that the hole pairs can be used to discharge electrons of the charge trap layer CT, setting the time manually to, for example, several seconds may be too long for erasure operations. Thus, according to an exemplary embodiment, sufficient distribution of charges in the channel layer SC for performing erasure operation is detected by sensing that a voltage of the bit line BL is sufficiently high where such a voltage level indicates the voltage of the channel layer SC due to charge accumulation. The detection result is used to trigger speedier erasure operations.

According to an example, a gate induced drain leakage (GIDL) phenomenon is used for erasure operations, where voltages supplied to the source line SL and the source selection line SSL are controlled to generate hot holes, the voltages supplied to the source line SL and the source selection line SSL is controlled so that sufficient hot holes can be injected to form a high electric field. Consequently, the electrons of the charge trap layer CT are discharged and the memory cells can be properly erased.

However, as described above with reference to FIG. 2, in the 3-D memory string, the memory cells of plural layers are formed in the U-shaped channel structure. Here, the injection state of holes in an erase operation may be dependent on various parameters. If a point of time when hot holes h are distributed throughout the channel layer SC from the source line SL to the bit line BL and a point of time when the erase operation is to be performed using the number of hot holes h injected into the channel layer SC are determined, the erase operation can be adequately performed using the hot holes and within a desired target time. According to an example, the point of time when the hot holes h are distributed throughout the channel layer SC may be a point of time when the hot holes h from the source line SL reach the channel layer SC surrounded by the drain selection line DSL. According to an example, the point of time when the hot holes h from the source line SL reach the channel layer SC surrounded by the drain selection line DSL may be determined by measuring a voltage of the bit line BL coupled to the channel layer SC. This is described in more detail as follows.

Figure 4:
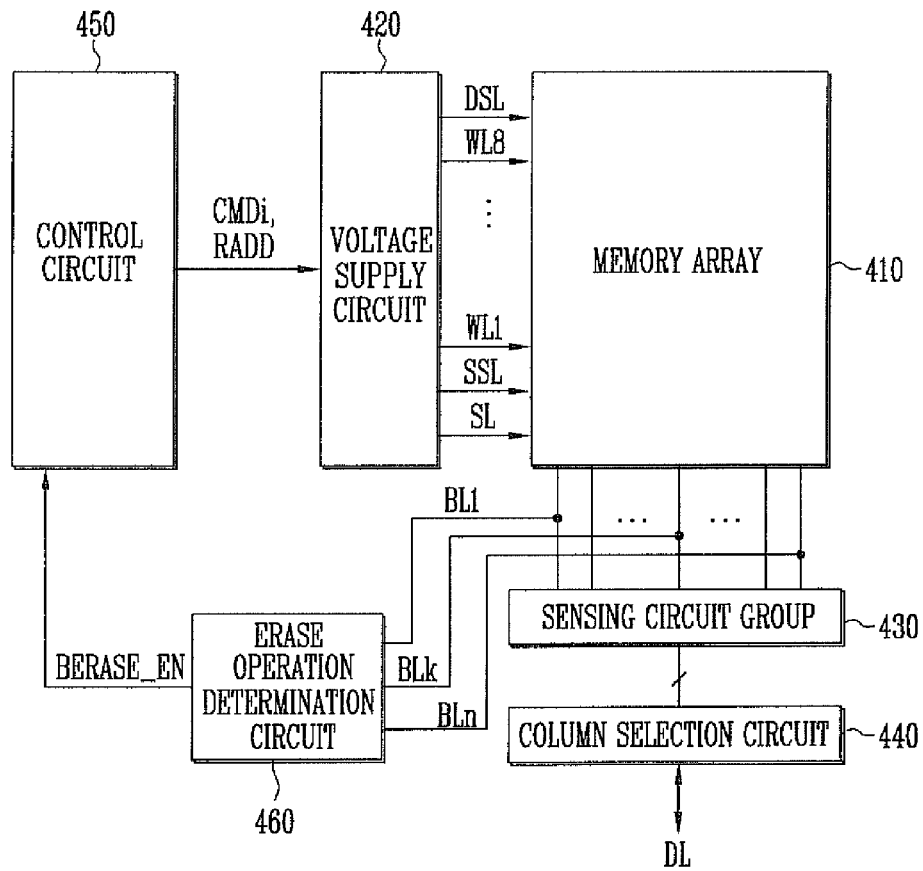
FIG. 4 is a block diagram of a semiconductor memory apparatus according to an exemplary embodiment of this disclosure.

FIG. 4 is a block diagram of a semiconductor memory apparatus according to an exemplary embodiment of this disclosure.

Referring to FIG. 4, the semiconductor memory apparatus includes a memory array 410, an operation circuit group (a voltage supply circuit 420, a sensing circuit group 430, and a column selection circuit 440), a control circuit 450, and an erase operation determination circuit 460.

The memory array 410 includes a plurality of memory blocks. Each of the memory blocks includes a plurality of strings coupled between a source line SL and respective bit lines BL1, . . . , BLk, . . . , BLn. Each of the strings includes a drain select transistor, memory cells, a pipe transistor, and a source select transistor which are coupled between a respective bit line (for example, BL1) and the source line SL. The memory block has the same structure as that shown in FIG. 2, and thus, a detailed description thereof is omitted. According to an example, the number of word lines is eight (that is, WL1 to WL8) as shown in FIG. 2. The number of word lines (that is, the number of stacked memory cells) may be changed according to different environments in which the FIG. 2 circuit is implemented.

According to an example, an operation circuit group includes a voltage supply circuit 420, a sensing circuit group 430, and a column selection circuit 440 and is configured to perform a program operation, a read operation, or an erase operation on memory cells of a selected memory block.

The voltage supply circuit 420 supplies operation voltages for the program operation, the erase operation, or the read operation of memory cells to the drain selection line DSL, the word lines WL1 to WL8, the source selection line SSL, and the source line SL of a selected memory block in response to the internal command signal CMDi and the row address signal RADD of the control circuit 450. The voltage supply circuit 420 may include a voltage generation circuit and a row decoder. The voltage generation circuit of the voltage supply circuit 420 generates the operation voltages for program, reading, or erasing memory cells in response to the internal command signal CMDi of the control circuit 450. The row decoder of the voltage supply circuit 420 supplies the operation voltages of the voltage generation circuit to the local lines DSL, WL1 to WL8, and SSL and the source line SL of a selected one of the memory blocks of the memory array 410 in response to the row address signals RADD of the control circuit 450.

The sensing circuit group 430 includes sensing circuits coupled to the bit lines BL1 to BLn. The sensing circuits may each be a page buffer used in a NAND flash memory device. The sensing circuit group 430 functions to temporarily store data to be stored in the memory cells and to control the voltages of the bit lines BL1 to BLn according to data when a program operation is performed. Furthermore, the sensing circuit group 430 functions to sense the threshold voltage levels of the memory cells through the bit lines BL1 to BLn and to temporarily store data corresponding to the sensed results, when a read operation is performed.

The column selection circuit 440 sequentially transfers external input data to the sensing circuits of the sensing circuit group 430 in order to store the input data in the memory cells. Furthermore, the column selection circuit 440 functions to sequentially output data, read from the memory cells and stored in the sensing circuits of the sensing circuit group 430, to a data line DL.

The erase operation determination circuit 460 determines whether a sufficient number of hot holes for erasing the memory cells have been injected into the channel layer (refer to SC of FIG. 3) of a memory string of the memory block by, for example, sensing a respective voltage of the bit lines BL1 to BLn. The erase operation determination circuit 460 outputs a block erase enable signal BERASE_EN (for example, enabled block erase enable signal BERASE_EN) in response to the determination. The control circuit 450 controls the voltage supply circuit 420 in order to erase the memory cells of a selected memory block in response to the block erase enable signal BERASE_EN. The voltage supply circuit 420 controls the voltages of the local lines DSL, WL1 to WLn, SSL and the source line SL so that the memory cells can be erased under the control of the control circuit 450.

The erase operation determination circuit 460 according to an example operates as follows.

Figure 5:
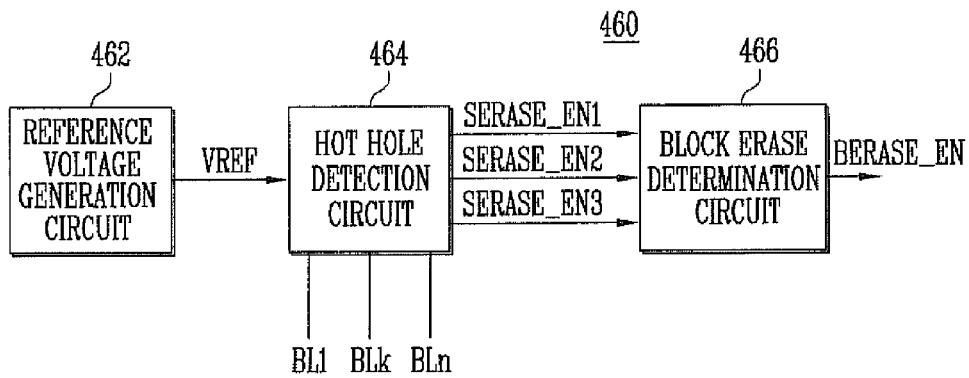
FIG. 5 is a block diagram of an erase operation determination circuit shown in FIG. 4.

FIG. 5 is a block diagram of the erase operation determination circuit shown in FIG. 4.

Referring to FIG. 5, the erase operation determination circuit 460 includes a reference voltage generation circuit 462, a hot hole detection circuit 464, and a block erase determination circuit 466.

When an erase operation mode is entered, the reference voltage generation circuit 462 generates a reference voltage VREF. The reference voltage VREF is compared with each of the voltages of the bit lines. The reference voltage VREF may be changed in response to an internal signal. For example, when an internal signal to inform an entry into the erase operation mode (for example, an internal signal such as Erase LOGRST) and bias setting signals (for example, Erase DLE and CTLBUS<2:0>) are inputted to the decoder of the reference voltage generation circuit 462, the decoder outputs an output signal (for example, SEV<7:0>) of 8 bits and an inverse of the output signal (for example, SEV N<7:0>) of 8 bits. The reference voltage output unit of the reference voltage generation circuit 462 generates the reference voltage VREF in response to the output signal, the inverse of the output signal, a band gap reference voltage, and an enable signal (for example, REF_DET_EN). Here, the level of the reference voltage VREF may be controlled in units of 500 mV to be in a range between 0.6 V and 1.0 V in response to the bias set signal (for example, CTLBUS<2:0>).

The hot hole detection circuit 464 compares the voltage (or potential) of a bit line and the reference voltage VREF in order to determine a point of time when the erase operation is to be started. More specifically, the hot hole detection circuit 464 compares the voltage of a bit line (for example, the bit line BL coupled to the channel layer SC for determining a supply of a minimum target number of hot holes) and the reference voltage VREF in order to compare the number of hot holes supplied and a target number so that an erasure of a memory string is activated in response to a detection that the target number of hot holes in a channel layer SC has been reached by, for example, detecting a voltage of a bit line BL such as the respective bit line coupled to the channel layer SC. To this end, a band gap reference voltage and an enable signal (for example, Erase_DET_EN which is not shown) may be further inputted to the hot hole detection circuit 464. While only bit lines BL1, BLk and BLn are shown as being coupled to the hot hole detection circuit 464 in FIG. 5, any one or more bit lines can be coupled to the hot hole detection circuit 464 in FIG. 5 for detection of the bit line voltage detection operation described above. According to an example, the hot hole detection circuit 464 compares the reference voltage VREF with each of the voltages on the first bit line BL1, a bit line (e.g., BLk) located in the middle portion, and the last bit line BLn of the bit lines coupled to the memory block. Whether hot holes have been uniformly injected into the channel layers SC of the memory block can be checked by comparing the reference voltage VREF and each of voltages of the bit lines BL1, BLk, and BLn. Furthermore, by comparing the reference voltage VREF and each of voltages of the bit lines BL1, BLk, and BLn, the erase characteristic of memory cells of the memory block can be uniformly controlled by using several bit line voltages together in making a determination whether to start erasure operations of memory strings.

According to the second example, if the voltages of respective bit lines are determined to be higher than the reference voltage (that is, if the hot holes are determined to be sufficiently injected into the channel layer SC), the hot hole detection circuit 464 generates string erase enable signals SERASE_EN1, SERASE_EN2, and SERASE_EN3 corresponding to the respective bit lines (for example, activated string erase enable signals SERASE_EN1, SERASE_EN2, and SERASE_EN3).

When all the string erase enable signals SERASE_EN1, SERASE_EN2, and SERASE_EN3 are activated, the block erase determination circuit 466 outputs the block erase enable signal BERASE_EN to the control circuit 450. While the block erase determination circuit 466 is shown to receive string erase enable signals SERASE_EN1, SERASE_EN2, and SERASE_EN3, the block erase determination circuit 466 may alternatively receive any one or more string erase enable signals generated by the hot hole detection circuit 464 in response to detection of a voltage of any one or more bit lines BLs as described above and generate the block erase enable signal BERASE_EN in response to the one or more string erase enable signals. The control circuit 450 controls the operation circuit group in response to the block erase enable signal BERASE_EN so that the erase operation of the memory block can be performed.

As described above, according to examples, a point of time when the erase operation is to be started can be changed according to a level of the reference voltage VREF. Thus, the level of the reference voltage VREF is set to a desired level. The potential of a respective bit line sensed by the hot hole detection circuit 464 is dependent on the number of hot holes h injected into the channel layer (refer to SC of FIG. 3) of the memory string. The number of injected hot holes depends on the number of strings included in a memory block, the number of memory blocks included in a memory array or plane, and the extent that GIDL phenomenon occur.

If a minimum number of hot holes for properly performing an erase operation is already known, a desired voltage of a respective bit line that corresponds to the desired number of injected hot holes (e.g., the minimum number of hot holes) can be estimated. Consequently, a point of time when the erase operation is to be started can be accurately controlled by controlling a level of the reference voltage VREF based on the estimated voltage of a bit line that corresponds to a minimum number of hot holes created in a channel layer SC for properly performing an erase operation.

The number of injected hot holes may be estimated as follows.

In the 3-D memory array of FIG. 2, after a bit line capacitance for a unit cell is found, the bit line capacitance is multiplied by the number of memory strings included in a memory block and the number of memory blocks included in a memory array or plane to obtain the total bit line capacitance of the memory cells in the memory block. In this case, the bit line capacitance per memory block is found using Equation 1 below.

$$BL \text{ capacitance/Plane} = [BL \text{ capacitance/unit cell}] \times [\text{Number of strings/blocks}] \times [\text{Number of blocks/planes}] \quad \text{[Equation 1]}$$

If the reference voltage VREF is set to 0.8 V, an erase operation may be performed when the potential of the bit line becomes higher than 0.8 V due to GIDL phenomenon.

Meanwhile, the amount of charges of a respective bit line for estimating the point of time when the erase operation is started is found using Equation 2 below.

$$\text{Required Charge } Q = [BL \text{ capacitance/memory block}] \times [\text{Reference voltage level}] \quad \text{[Equation 2]}$$

The total amount of required GIDL current is found using Equation 3 below.

$$\text{Required Total } GIDL \text{ Current} = [\text{Required Charge } Q]/[\text{Charging Time}] \quad \text{[Equation 3]}$$

The total amount of GIDL current per memory string is found using Equation 4 below.

$$\text{Required total } GIDL \text{ current per source selection line } SSL = [\text{Required total } GIDL \text{ current}] \times [SSL/\text{String}]. \quad \text{[Equation 4]}$$

Here, the GIDL current is indicated by the required total GIDL current per the source selection line SSL because it is supplied from the source selection line SSL included in the strings.

Since the number of hot holes injected into the channel layer is determined according to the GIDL current, the number of injected hot holes can be estimated and a level of the reference voltage VREF can be determined, based on the GIDL current.

The above described method is only exemplary, and a level of the reference voltage VREF may be determined by using other methods. In other words, the above described equations may be changed according to different design parameters including, for example, operation voltages and cell sizes. Here, an appropriate reference voltage VREF may be changed as appropriate by performing appropriate tests.

Figure 6:
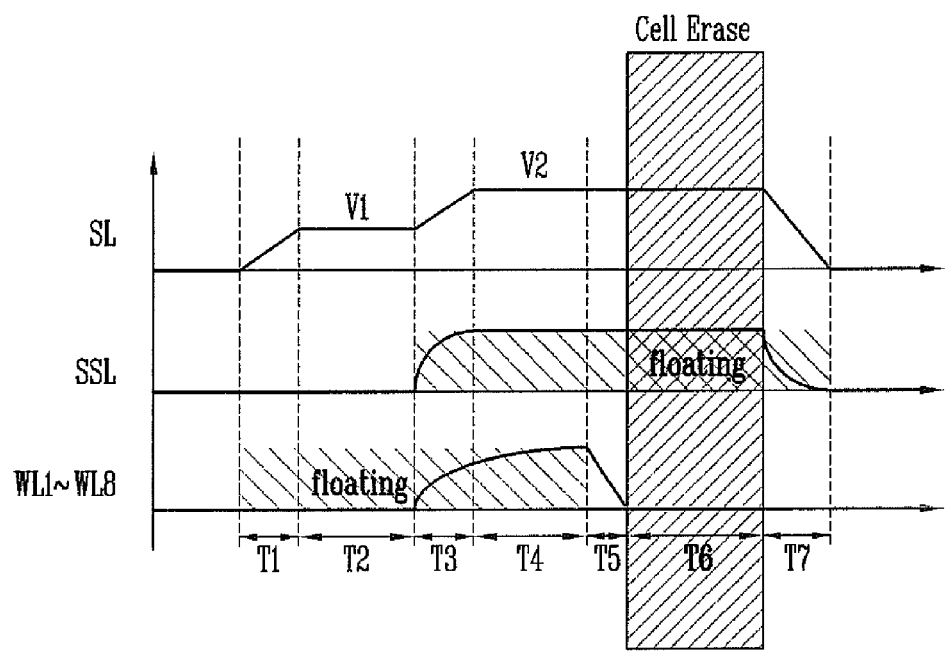
FIG. 6 is a waveform illustrating a method of operating the semiconductor memory apparatus according to an exemplary embodiment of this disclosure.

FIG. 6 is a waveform illustrating a method of operating a semiconductor memory apparatus according to an exemplary embodiment of this disclosure.

Referring to FIG. 6, an operation of supplying hot holes is performed in sections T1 and T2. Referring to FIGS. 3 and 4, the voltage supply circuit 420 sets the word lines WL1 to WL8 in a floating state and supplies a ground voltage to the source selection line SSL. When a hot hole supply voltage V1 is supplied to the source line SL, the hot holes h are injected into the channel layer SC due to occurrence of GIDL current. The potential of the bit line BL is raised by the hot holes h.

The erase operation determination circuit 460 determines whether a target number of the hot holes h have been injected into the channel layer SC by sensing the potential of a respective bit line BL. If, as a result of the determination, the target number or higher of hot holes h is determined to have been injected into the channel layer SC based on the sensed potential of the bit line BL, the erase operation determination circuit 460 outputs the block erase enable signal BERASE_EN to the control circuit 450.

In sections T3 to T5 (FIG. 6), the control circuit 450 controls the voltage supply circuit 420 in response to the block erase enable signal BERASE_EN so that the source selection line SSL is at a floating state and an erase voltage V2 is supplied to the source line SL. When the erase voltage V2 is supplied to the source line SL, the voltages of the word lines WL1 to WL8 and the source selection line SSL, which is in a floating state, are raised by capacitive coupling.

Next, in section T6, when the voltage supply circuit 420 supplies the ground voltage to the word lines WL1 to WL8, a voltage difference between the word lines WL1 to WL8 and the channel layer SC is increased sufficiently so that electrons trapped in the charge trap layer CT are discharged toward the channel layer SC. Next, in section T7, the supply of the erase voltage V2 is terminated, and the erase operation is completed.

According to the embodiments of this disclosure, optimal operation conditions are set and the semiconductor memory apparatus is operated under the conditions. Accordingly, the characteristic of the semiconductor memory apparatus can be improved.

What is claimed is:

1. A semiconductor memory apparatus, comprising:
a memory block including memory strings having respective channel layers coupled between respective bit lines and a source line;
an operation circuit group configured to supply hot holes to the channel layers and to perform an erase operation on memory cells of the memory strings;
an erase operation determination circuit configured to determine whether hot holes of a target number are injected into a first channel layer of the channel layers and generate a block erase enable signal for erasing the memory cells when the hot holes of at least the target number are supplied to the first channel layer; and
a control circuit configured to control a point of time where the operation circuit group performs the erase operation in response to the block erase enable signal.

2. The semiconductor memory apparatus of claim 1, wherein the erase operation determination circuit is configured to determine a number of hot holes supplied to the first channel layer by sensing a voltage of a first bit line of the bit lines and the sensed voltage indicates the number of hot holes injected into the first channel layer.

3. The semiconductor memory apparatus of claim 1, wherein the erase operation determination circuit is configured to output the block erase enable signal when hot holes of at least the target number are supplied to the first channel layer.

4. The semiconductor memory apparatus of claim 3, wherein the erase operation determination circuit is configured to determine a number of hot holes supplied to each of the channel layers by sensing a voltage of a respective one of the bit lines that varies according to the number of hot holes injected into the respective channel layer.

5. The semiconductor memory apparatus of claim 1, wherein the erase operation determination circuit is configured to output the block erase enable signal when hot holes of at least the target number are supplied to each of the channel layers of a first memory string, a memory string placed at a middle portion of the memory strings, and a last memory string in order among the memory strings.

6. The semiconductor memory apparatus of claim 5, wherein the erase operation determination circuit is configured to determine a number of hot holes supplied to each of the channel layers by sensing a voltage of a respective one of the bit lines and the sensed voltage varies according to the number of hot holes injected into the channel layer.

7. The semiconductor memory apparatus of claim 1, wherein the erase operation determination circuit comprises: a reference voltage generation circuit configured to generate a reference voltage; a hot hole detection circuit configured to detect a number of hot holes supplied to the first channel layer by comparing the reference voltage with a voltage of a respective one of the bit lines that varies according to the number of hot holes supplied to the first channel layer and for generating a string erase enable signal according to a result of the detection; and a block erase determination circuit configured to generate the block erase enable signal in response to the string erase enable signal.

8. The semiconductor memory apparatus of claim 5, wherein the erase operation determination circuit comprises: a reference voltage generation circuit configured to generate a reference voltage; a hot hole detection circuit configured to compare the reference voltage and each of voltages of the bit lines of the first memory string, the memory string placed at a middle portion of the memory strings, and the last memory string in order among the memory strings, wherein the voltages of the bits lines of the first memory string, the memory string placed at a middle portion of the memory strings, and the last memory string each vary according to a number of hot holes supplied to a respective one of the channel layers, and, if as a result of the comparison, hot holes of at least the target number are determined to have been supplied to each of the channel layers of the three memory strings, generate first to third string erase enable signals; and a block erase determination circuit configured to generate the block erase enable signal in response to the first to third string erase enable signals.

9. The semiconductor memory apparatus of claim 1, wherein the operation circuit group is configured to supply voltage for creating hot holes to the source line so that hot holes are supplied to the channel layers in a state where word lines of the memory cells of the memory strings are floating.

10. The semiconductor memory apparatus of claim 9, wherein, in response to a determination by the erase operation determination circuit that hot holes of at least the target number have been supplied to the first channel layer, the operation circuit group is configured to supply an erase voltage to the source line and subsequently supply a ground voltage to the word lines.

11. The semiconductor memory apparatus of claim 1, wherein the channel layers each have a U-shaped three-dimensional (3-D) structure.

12. The semiconductor memory apparatus of claim 1, wherein the channel layers are each formed of a polysilicon layer doped with an impurity having five valence electrons.

13. The semiconductor memory apparatus of claim 1, the control circuit is configured to determine to supply a voltage that creates hot holes in the channel layers and, in response to a determination by the erase operation determination circuit that hot holes of at least the target number have been supplied to the first channel layer by comparing a voltage of a bit line coupled to the first channel layer with a reference voltage, supply an erase voltage to the source line and a ground voltage to at least one word line for performing the erase operation.

14. The semiconductor memory apparatus of claim 1, the control circuit is configured to determine to supply a voltage that creates hot holes in the channel layers and, in response to a determination by the erase operation determination circuit that hot holes of at least the target number have been supplied to two or more of the channel layers by comparing voltages of respective bit lines coupled to the two or more channel layers to a reference voltage, supply an erase voltage of the source line and a ground voltage to at least one word line other than the two or more of the channel layers for performing the erase operation.

15. A method of operating a semiconductor memory apparatus, comprising:
 supplying hot holes to channel layers of memory strings coupled between respective bit lines and a source line;
 determining whether hot holes of a target number are infected into the channel layers; and
 performing an erase operation on memory cells of the memory strings when hot holes of at least the target number have been supplied to the channel layers.

16. The method of claim 15, the determining whether hot holes of a target number are injected into the channel layers comprising:
 comparing the target number and a number of hot holes supplied to each of the channel layers.

17. The method of claim 16, wherein comparing the target number and the number of hot holes supplied to each of the channel layers is performed by comparing a reference voltage and each of voltages of the bit lines and the voltages of the bit lines each vary according to the number of hot holes supplied to the respective channels.

18. The method of claim 15, wherein when hot holes of at least the target number are supplied to each of the channels of two or more of the memory strings, the erase operation is performed.

19. The method of claim 15, wherein the erase operation is performed when hot holes of at least the target number are supplied to each of the channel layers of a first memory string, a memory string placed in a middle portion, and a last memory string in order among the memory strings.

20. The method of claim 17, wherein when each of the voltages of the bit lines is higher than the reference voltage, the erase operation is performed.

* * * * *